US006602787B2

(12) United States Patent
Komai et al.

(10) Patent No.: US 6,602,787 B2
(45) Date of Patent: Aug. 5, 2003

(54) METHOD FOR FABRICATING SEMICONDUCTOR DEVICES

(75) Inventors: Naoki Komai, Kanagawa (JP); Takeshi Nogami, Kanagawa (JP); Hideyuki Kito, Kanagawa (JP); Mitsuru Taguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/879,782

(22) Filed: Jun. 12, 2001

(65) Prior Publication Data

US 2002/0068438 A1 Jun. 6, 2002

(30) Foreign Application Priority Data

Jun. 13, 2000 (JP) ......................... 2000-176216

(51) Int. Cl.[7] .................. H01L 21/44; H01L 21/302
(52) U.S. Cl. ................... 438/687; 438/641; 438/674; 438/689; 438/754
(58) Field of Search .................. 438/687, 689, 438/641, 674, 671, 678, 754, 942–944

(56) References Cited

U.S. PATENT DOCUMENTS 6,268,289 B1 * 7/2001 Chowdhury et al.
6,423,636 B1 * 7/2002 Dordi et al.

* cited by examiner

*Primary Examiner*—Ha Tran Nguyen
(74) *Attorney, Agent, or Firm*—Robert J. Depke; Holland & Knight LLC

(57) ABSTRACT

The present invention is to provide a method for fabricating semiconductor devices capable of eliminating a height difference on a base member caused by a residual plating seed layer remained in a portion where an electrode comes into contact and is thus prevented from contacting with an electrolytic polishing fluid, where such height difference has been a problem in introducing the electrolytic polishing process into wafer process. The method comprises the steps of forming a plating seed layer on the base member; forming by the plating process a plated film on the plating seed layer in an area excluding the outer peripheral portion of the base member; polishing the plated film together with the plating seed layer by the electrolytic polishing process; and selectively removing the plating seed layer remaining on the outer peripheral portion of the base member.

12 Claims, 3 Drawing Sheets

METHOD FOR FABRICATING SEMICONDUCTOR DEVICES

This application claims the benefit of a provisional application, entitled "High Throughput In-Line and Batch Hybrid Coating," which was filed on Jun. 29, 2001, and assigned Provisional Application No. 60/301,478 which is hereby incorporated by reference.

RELATED APPLICATION DATA

The present and foregoing application claim priority to Japanese Application No. P2000-176216 filed Jun. 13, 2000. All of the foregoing applications are incorporated herein by reference to the extent permitted by law.

BACKGROUND OF THE INVENTION

1. Field of the Invention

The present invention relates to a method for fabricating semiconductor devices, and in more detail a method for fabricating semiconductor devices in which a multi-layered wiring structure is formed by the dual-damascene process.

2. Description of the Related Art

Aluminum alloy has widely been used as a wiring material for LSIs. It has, however, been becoming more difficult to ensure sufficient properties (high reliability and low resistivity) with such aluminum alloy wiring in recent trends toward downsizing of LSIs and speeding-up in the operation thereof. One countermeasure for solving such problems relates to copper wiring which is more excellent in electromigration resistance and lower in resistivity as compared with those of conventional aluminum alloy wiring, and has been introduced into some of semiconductor devices.

In the copper wiring process, groove wiring is considered to be practical since copper is generally less processable by dry etching. In the groove wiring, a predetermined groove is formed in an insulating film typically made of silicon oxide, the groove is then filled with a wiring material, and then the excessive portion of such wiring material is removed by, for example, chemical mechanical polishing (abbreviated as CMP hereinafter), to thereby form a wiring within the groove.

Methods for filling a wiring material in the groove wiring process, which are under investigation, include electrolytic plating process, chemical vapor deposition process (abbreviated as CVD hereinafter), a combined process of sputtering and reflow, high pressure reflow process, and electroless plating process. Among these, electroless plating process is practiced in recent fabrication of semiconductor devices in view of film formation rate, film formation cost, purity of the obtained metal film and adhesiveness.

An exemplary process for filling, by the electroless plating process, copper as a wiring material into the groove and a connection hole will be described below.

A groove is formed in an intermediate-layer insulating film provided on the base member. On such intermediate-layer insulating film and on the inner surface of the groove, a barrier layer typically comprising a tantalum nitride (TaN) film of 30 nm thick is formed by sputtering. The barrier layer is responsible for preventing copper from diffusing into the intermediate-layer insulating film made of a silicon oxide film. Next, the plating seed layer typically comprising a copper film of 150 nm thick is formed by sputtering on the plating seed layer. The plating seed layer serves as a seed layer for assisting growth of a copper layer through the successive electrolytic plating.

Next, on the surface of such plating seed layer, a copper film is grown by electroplating so as to fill the groove and so as to cover the intermediate-layer insulating film while being interposed with the barrier layer.

An excessive portion of the copper film on the intermediate-layer insulating film is then removed to thereby form a wiring. While the removal generally employs CMP, one possible alternative relates to a method in which the copper film formed by electroplating is subjected to etch-back by electrolytic polishing. The electrolytic polishing refers to a polishing method in which metal surface is dissolved on the anode side in a special solution to thereby obtain a smooth and glossy surface. It has been a conventional practice to employ the electrolytic polishing mainly for deburring and raising glossiness of the surface with respect to aluminum or stainless steel, and for pretreatment of plating with respect to copper or copper alloy.

For the case the electrolytic polishing process is adopted to the wafer process, it will be necessary to bring an electrode 111 in contact with a plating seed layer 103 which is previously formed on a wafer 101 while being interposed with a barrier layer 102 as shown in FIG. 3A. In some cases, it is also necessary to seal the outer peripheral portion of the wafer 101 using a seal member (e.g., O-ring) so as to avoid contact between the contacted electrode 111 and an electrolytic polishing fluid 121.

This, however, allows the plating seed layer 103 to be remained after completion of the electrolytic polishing in a portion not brought into contact with the electrolytic polishing fluid (not shown) such as those shadowed by the electrode 111 or on the outer peripheral portion of the wafer 101 as shown in FIG. 3B. Such residual plating seed layer 103 will be causative of a large height difference on the outer peripheral portion of the wafer 101.

Forming an insulating film 104 in the next process step will thus result in the formation of a large step portion S on the surface of such insulating film 104 due to the pattern edge of the residual seed layer 103 as shown in FIG. 3C. This requires an another process step for planarizing the surface of the insulating film 104. Failure in removing such step portion S will be causative of peeling off of a wiring formed further thereon.

SUMMARY OF THE INVENTION

As has been described in the above, residual metal wiring material in a field of a wafer will result in various disadvantages such as inter-wiring short-circuit and degraded step portion coverage.

It is therefore an object of the present invention to provide a method for producing semiconductor devices for the purpose of resolving the foregoing problems.

A first method for fabricating semiconductor devices according to one embodiment of the present invention comprises the steps of: forming a plating seed layer on the base member (e.g. wafer); forming by the plating process a plated film on the plating seed layer in an area excluding the outer peripheral portion of the base member; polishing the plated film together with the plating seed layer by the electrolytic polishing process; and selectively removing the plating seed layer remaining on the outer peripheral portion of the base member.

The first method for fabricating semiconductor devices has the step for selectively removing the plating seed layer remaining on the outer peripheral portion of the base member, so that the plating seed layer will never remain on the surface of the base member after the electrolytic polishing in a portion where an electrode for use in such electrolytic polishing is brought into contact, which desirably reduces in-plane height difference of the base member. Such reduction in the in-plane height difference after the electrolytic polishing and such removal of an unnecessary portion of the plated film and the plating seed layer composing the wiring material films can successfully raise the yield ratio of semiconductor devices, and can beneficially exclude necessity for post-growth planarization by CMP of the insulating film to thereby reduce the production cost.

A second method for fabricating semiconductor devices according to another embodiment of the present invention comprises the steps of: forming a plating seed layer on the base member; forming by the plating process a plated film on the plating seed layer in an area excluding the outer peripheral portion of the base member; removing by etching the plating seed layer on the outer peripheral portion of the base member; and polishing the plated film together with the plating seed layer by the electrolytic polishing process.

The second method for fabricating semiconductor devices has the step for removing by etching the plating seed layer on the outer peripheral portion of the base member, so that the plating seed layer will never remain on the surface of the base member after the electrolytic polishing, which desirably reduces in-plane height difference of the base member. Such reduction in the in-plane height difference after the electrolytic polishing and such removal of unnecessary portions of the plated film and the plating seed layer composing the wiring material films can successfully raise the yield ratio of semiconductor devices, and can beneficially exclude necessity for post-growth planarization by CMP of the insulating film to thereby reduce the production cost.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENT

An embodiment according to the first method for fabricating semiconductor devices of the present invention will be explained hereinafter referring to FIGS. 1A to 1F which are partial sectional views showing process steps therefor.

Although not shown, predetermined devices are fabricated into a substrate (e.g., semiconductor substrate), and an intermediate-layer insulating film is then formed thereon. A resist pattern having openings in predetermined positions is formed thereon by lithographic technology, and the intermediate-layer insulating film is then etched using such resist pattern as an etching mask to thereby form wiring grooves. The resist pattern is then removed.

Figure 1A:
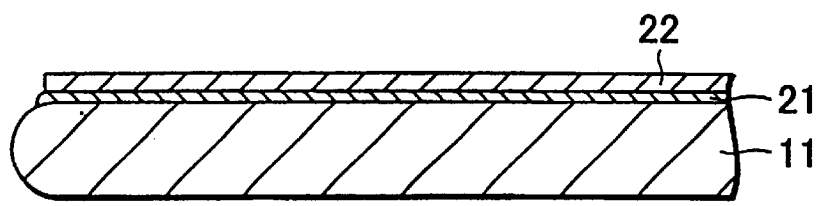
FIGS. 1A to 1F are partial sectional views showing process steps in an embodiment according to the first method for fabricating semiconductor devices of the present invention.

Next, as shown in FIG. 1A, a barrier layer 21 typically comprises a tungsten nitride film is formed for example by the CVD process on such treated base member 11. The formation of such tungsten nitride film can typically employ mixed gas of tungsten hexafluoride ($WF_6$), nitrogen ($N_2$) and hydrogen ($H_2$) as a source gas, and conditions of which relate to a flow rate of such source gas of 0.25 ml/min, and a film-growth temperature of 300 to 400° C.

Next, a plating seed layer 22 for assisting growth in the electoplating is formed using a copper film grown by the physical vapor deposition (PVD) process such as sputtering. The growth of such copper film can typically employ argon (Ar) as a process gas, and conditions of which relate to a DC power of a sputtering apparatus of 12 kW, a flow rate of such process gas of 50 $cm^3$/min, a pressure of a film-growth atmosphere of 0.2 Pa, and a film-growth temperature of 100° C.

Figure 1B:
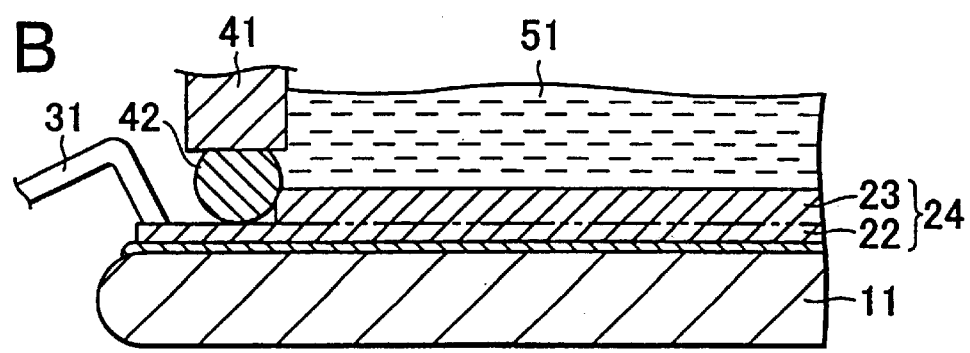

Next, as shown in FIG. 1B, a copper film typically having a thickness of 1.0 $\mu$m is then deposited by electroplating on the plating seed layer 22 to thereby form a plated layer 23 completely filling the foregoing wiring grooves (not shown). The plating seed layer 22 and the plated film 23 now together compose a wiring material film 24. The electroplating is proceeded while retaining a plating fluid 51 between a cup 41 having a recess on the side of the base member 11 and such base member 11. Now in such constitution, a seal member (e.g., O-ring) 42 is provided between the outer peripheral portion of the base member 11 and the outer edge of the cup 41 in order to avoid leakage of the plating fluid 51 toward the back surface of the base member 11 and to keep a cathode electrode 31 away from such plating fluid 51. The cathode electrode 31 is contacted to the plating seed layer 22. Since a space on the base member 11 to which the plating fluid 51 is fed is sealed by the cup 41 and the seal member 42, such plating fluid 51 retained between the base member 11 and the cup 41 will not leak outward. Thus the plated film 23 is grown only in an area inside the seal member 42.

The plating can typically employ a copper sulfate-base electroplating fluid as a plating fluid, and conditions of which relate to a plating current of 2.83 A, a growth rate of 4.5 minutes per 1 $\mu$m film growth, and a fluid temperature of 18° C.

Figure 1C:
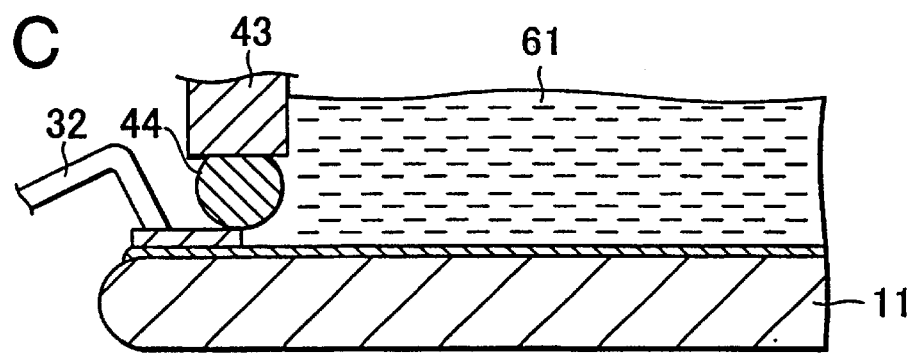
Figure 1D:
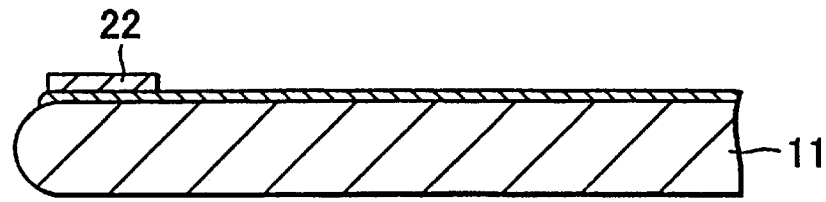

Next, as shown in FIG. 1C, the wiring material film 24 (see FIG. 1B) is subjected to the electrolytic polishing while supplying an electrolytic polishing fluid 61 into a space between the base member 11 and the cup 43, to thereby leave such wiring material film 24 only in the wiring grooves (not shown) and thus complete the groove wiring (not shown). The electrolytic polishing is proceeded while retaining an electrolytic polishing fluid 61 between a cup 43 having a recess on the side of the base member 11 and such base member 11. Now in such constitution, a seal member (e.g., O-ring) 44 is provided between the outer peripheral portion of the base member 11 and the outer edge of the cup 43 in order to avoid leakage of the electrolytic polishing fluid 61 toward the back surface of the base member 11 and to keep a cathode electrode 32 away from such electrolytic polishing fluid 61. The cathode electrode 32 is contacted to the plating seed layer 22. Since a space on the base member 11 to which the electrolytic polishing fluid 61 is fed is sealed by the cup 43 and the seal member 44, such electrolytic polishing fluid 61 retained between the base member 11 and the cup 43 will not leak outward. Thus the wiring material film 24 (see FIG. 1B) is polished only in an area inside the seal member 44. A portion of the plating seed layer 22 outside the seal member 44 (see FIG. 1C) remains unpolished on the base member 11 as shown in FIG. 1D. It should now be noted that the cup 43 and seal member 44 may be those used for the electroplating.

The electrolytic polishing can typically employ phosphoric acid (specific gravity=1.6) solution as a polishing fluid, and conditions of which relate to a current density of 5 to 20 $A/dm^2$, and a polishing temperature of 15 to 25° C. In such electrolytic polishing, electric current begins to flow through the barrier layer 21 having an electric conductivity lower than that of the copper film when the wiring material film 24 is exhausted in the field, so that the wiring material film 24 can keep the electric conductivity thereof higher than that in the peripheral as far as it exists, which makes the wiring material film 24 easy to be etched. Therefore, the wiring material film 24 in the field can be removed almost completely and uniformly.

Next, the plating seed layer 22 remaining on the outer peripheral portion on the base member 11 is removed by selectively supplying an etching fluid for copper.

A ferric chloride etching solution may typically be used as an etching fluid for copper, which contains 340 to 380 g/l of ferric chloride (360 g/l herein for example) and 5 to 60 ml of hydrochloric acid (30 ml herein for example). The temperature of the etching fluid may be 20 to 70° C. In this example, the temperature of 50° C. is employed.

It is also allowable to use a cupric chloride solution, which can contain 50 to 200 g/l of cupric chloride (100 g/l herein for example), 2 to 50 ml of hydrochloric acid (10 ml herein for example), and 5 to 70 g/l of potassium chloride (40 g/l herein for example). The temperature of the etching fluid can be 20 to 70° C. In this example, the temperature of 50° C. is employed.

It is still also possible to use an alkaline ammonia etching solution as an etching solution, which can contain 20 to 200 g/l of ammonium hydroxide (100 g/l herein for example), 50 to 150 g/l of ammonium chloride (80 g/l herein for example), 50 to 200 g/l of ammonium chlorite (120 g/l herein for example), 50 to 200 g/l of ammonium hydrogen carbonate (120 g/l herein for example), and 50 to 200 g/l of ammonium nitrate (120 g/l herein for example). The temperature of the etching fluid can be 20 to 70° C. In this example, the temperature of 50° C. is employed.

It is still also possible to use a mixed solution of hydrogen peroxide and hydrofluoric acid. The etching time of 1 to 3 minutes is employed in this example.

Figure 1E:
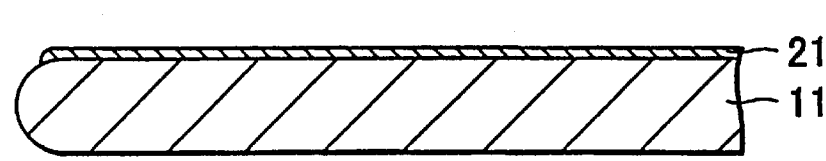

As a result of such process, the barrier layer 21 is left in the field of the base member 11 as shown in FIG. 1E.

Figure 1F:
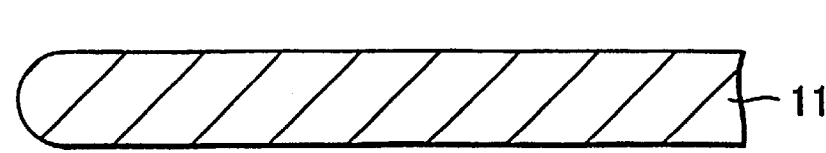

Next, the barrier layer 21 exposed after the removal of the wiring material film 24 is removed by, for example, spin cleaning using an aqueous hydrogen peroxide solution. This allows the base member 11 to be exposed as shown in FIG. 1F, and allows the groove wiring to be obtained in which the wiring groove is filled with the wiring material film 24 although not shown.

The removal of the barrier layer 21 made of tungsten nitride can employ an aqueous hydrogen peroxide solution as a rinsing fluid, and conditions of which set to a rinsing time of 1 to 3 minutes and the temperature of the rinsing fluid of 15 to 40° C.

The first method for fabricating semiconductor devices has the step for selectively removing the wiring material film 24 remaining on the outer peripheral portion of the base member 11, so that the plating seed layer 22 will never remain on the surface of the base member 11 after the electrolytic polishing in a portion where an electrode for use in such electrolytic polishing is brought into contact, which desirably reduces in-plane height difference of the base member 11. Such reduction in the in-plane height difference after the electrolytic polishing and such removal of an unnecessary portion of the wiring material films 24 can successfully raise the yield ratio of semiconductor devices.

Next, an embodiment according to the second method for fabricating semiconductor devices of the present invention will be explained hereinafter referring to FIGS. 2A to 2F which are partial sectional views showing process steps therefor.

Similarly to the embodiment according to the first method, although not shown, predetermined devices are fabricated into a substrate, and an intermediate-layer insulating film is then formed thereon. Wiring grooves are then formed in the intermediate-layer insulating film.

Figure 2A:
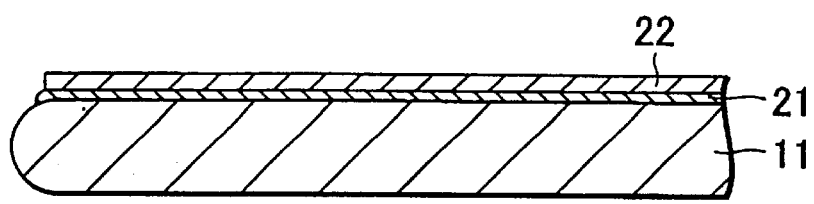
FIGS. 2A to 2F are partial sectional views showing process steps in an embodiment according to the second method for fabricating semiconductor devices of the present invention.

Next, as shown in FIG. 2A, similarly to the processes described referring to FIG. 1A, the first barrier layer 21 typically comprises a tungsten nitride film is formed for example by the CVD process on such treated base member 11. The plating seed layer 22 for assisting growth in the electoplating is then formed using a copper film grown by the physical vapor deposition (PVD) process such as sputtering.

Figure 2B:
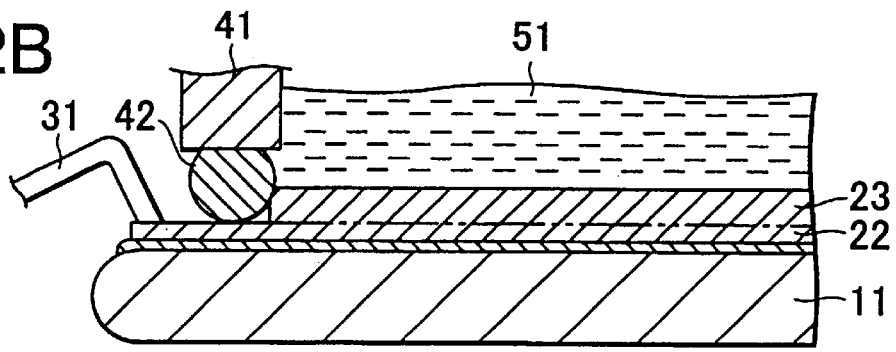

Next, as shown in FIG. 2B, similarly to the processes described referring to FIG. 1B, a copper film typically having a thickness of 1.0 µm is then deposited by electroplating on the plating seed layer 22 to thereby form the plated layer 23 completely filling the foregoing wiring grooves (not shown). The plating seed layer 22 and the plated film 23 now together compose the wiring material film 24. The electroplating is proceeded while retaining the plating fluid 51 between the cup 41 having a recess on the side of the base member 11 and such base member 11. Now in such constitution, the seal member (e.g., O-ring) 42 is provided between the outer peripheral portion of the base member 11 and the outer edge of the cup 41 in order to avoid leakage of the plating fluid 51 toward the back surface of the base member 11 and to keep a cathode electrode 31 away from such plating fluid 51. Since a space on the base member 11 to which the plating fluid 51 is fed is sealed by the cup 41 and the seal member 42, such plating fluid 51 retained between the base member 11 and the cup 41 will not leak outward. Thus the plated film 23 is grown only in an area inside the seal member 42.

Figure 2C:
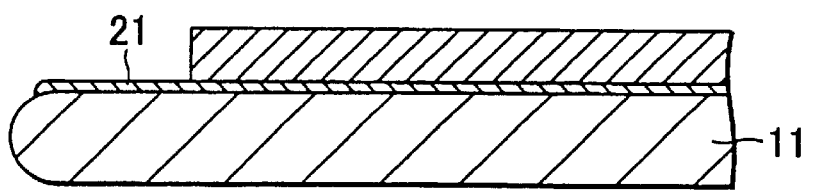

Next, as shown in FIG. 2C, a portion of the plating seed layer 22 exposed in the outer peripheral portion on the base member 11 (see FIG. 2B) is then removed by selectively supplying an etching fluid incapable of etching the barrier layer 21. Examples of the available etching fluid include ferric chloride etching fluid, cupric chloride etching fluid, and alkaline ammonia etching fluid.

Figure 2D:
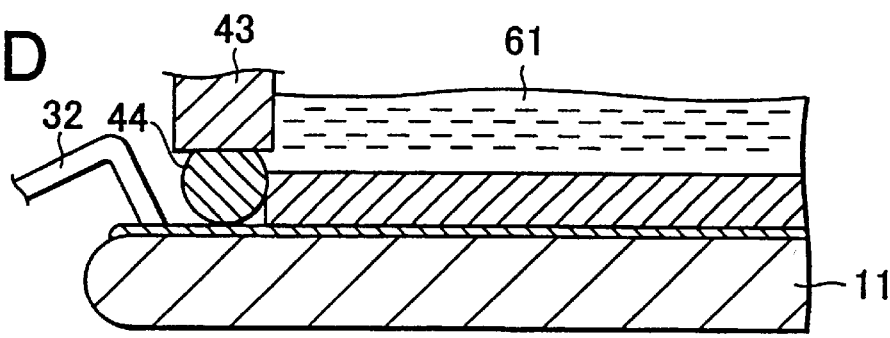

Next, as shown in FIG. 2D, similarly to the processes described referring to FIG. 1C, the wiring material film 24 is subjected to the electrolytic polishing, to thereby leave such wiring material film 24 only in the wiring grooves (not shown) and thus complete the groove wiring (not shown). The electrolytic polishing is proceeded while retaining the electrolytic polishing fluid 61 between the cup 43 having a recess on the side of the base member 11 and such base member 11. Now in such constitution, the seal member (e.g., O-ring) 44 is provided between the outer peripheral portion of the base member 11 and the outer edge of the cup 43 in order to avoid leakage of the electrolytic polishing fluid 61 toward the back surface of the base member 11 and to keep the cathode electrode 32 away from such electrolytic polishing fluid 61. The cathode electrode 32 is contacted to the barrier layer 21. Since a space on the base member 11 to which the electrolytic polishing fluid 61 is fed is sealed by the cup 43 and the seal member 44, such electrolytic polishing fluid 61 retained between the base member 11 and the cup 43 will not leak outward. Thus the wiring material film 24 inside the seal member 44 is polished.

The electrolytic polishing can typically employ phosphoric acid (specific gravity=1.6) solution as a polishing fluid, and conditions of which relate to a current density of 5 to 20 A/dm$^2$, and a polishing temperature of 15 to 25° C. In such electrolytic polishing, electric current begins to flow through the barrier layer 21 having an electric conductivity lower than that of the copper film when the wiring material film 24 is exhausted in the field, so that the wiring material film 24 can keep the electric conductivity thereof higher than that in the peripheral as far as it exists, which makes the wiring material film 24 easy to be etched. Therefore, the wiring material film 24 in the field can be removed almost completely and uniformly. It should now be noted that the cup 43 and seal member 44 may be those used for the electroplating.

Figure 2E:
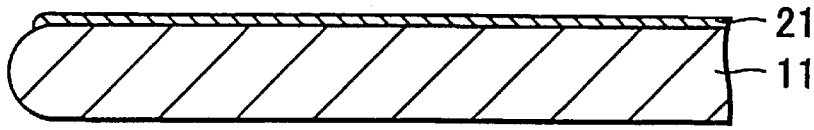

As a result of such process, the barrier layer 21 is left in the field on the base member 11 as shown in FIG. 2E.

Figure 2F:
Figure 3A:
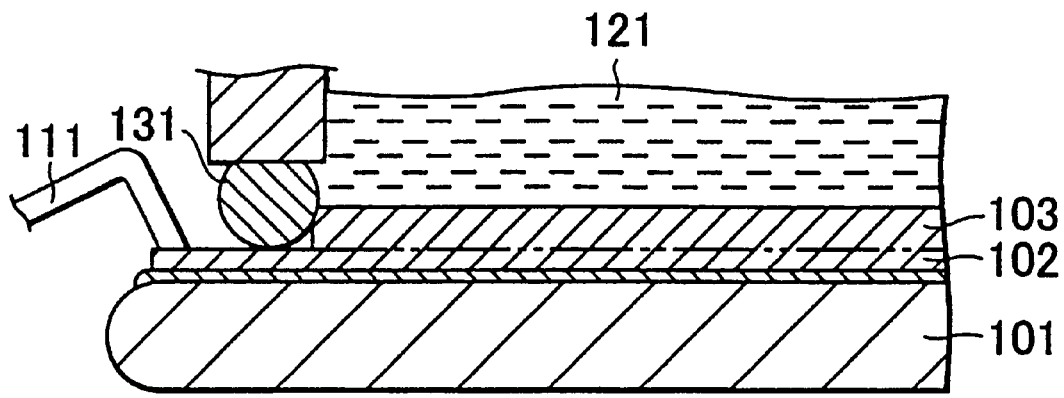
FIGS. 3A to 3C are partial sectional views showing a problem in the related art.
Figure 3B:
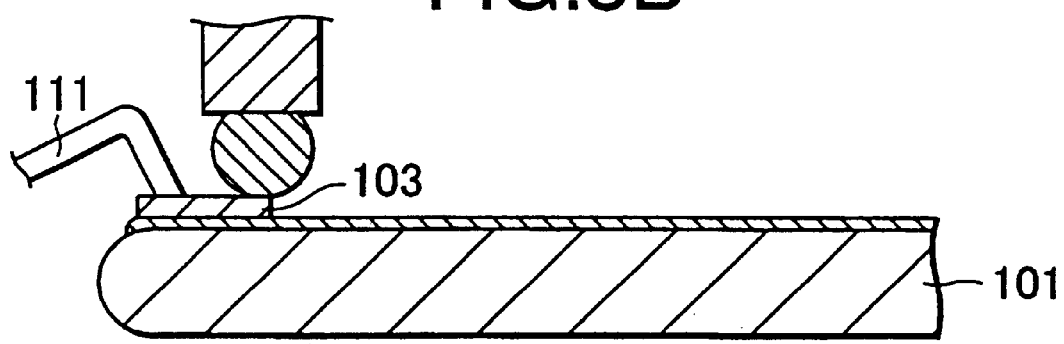
Figure 3C:
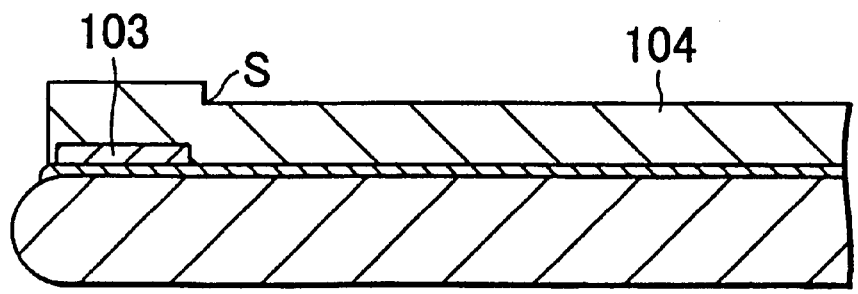

Next, the barrier layer 21 exposed after the removal of the wiring material film 24 is removed by, for example, spin cleaning using an aqueous hydrogen peroxide solution. This allows the base member 11 to be exposed as shown in FIG. 2F, and allows the groove wiring to be obtained in which the wiring groove is filled with the wiring material film.

The removal of the barrier layer 21 made of tungsten nitride can employ an aqueous hydrogen peroxide solution as a rinsing fluid, and conditions of which relate to a rinsing time of 1 to 3 minutes and the temperature of the rinsing fluid of 15 to 40° C.

The second method for fabricating semiconductor devices has the step for selectively etching off a portion of the plating seed layer 22 exposed in the outer peripheral portion on the base member 11, so that the plating seed layer 22 will never remain on the surface of the base member 11 after the electrolytic polishing, which desirably reduces in-plane height difference of the base member 11. Such reduction in the in-plane height difference after the electrolytic polishing and such removal of unnecessary portions of the plated film 23 and the plating seed layer 22 composing the wiring material films 24 can successfully raise the yield ratio of semiconductor devices.

Although the invention has been described in its preferred form with a certain degree of particularity, obviously many changes and variations are possible therein. It is therefore to be understood that the present invention may be practiced otherwise than as specifically described herein without departing from the scope and the sprit thereof.

What is claimed is:

1. A method for fabricating semiconductor devices comprising the steps of:
    forming a plating seed layer on a base member;
    forming by a plating process a plated film on said plating seed layer in an area excluding the outer peripheral portion of said base member;
    polishing said plated film together with said plating seed layer by an electrolytic polishing process while using an outer peripheral portion of the plating seed layer as an electrical contact for the electrolytic polishing process; and
    thereafter selectively removing said plating seed layer remaining on the outer peripheral portion of said base member.

2. The method for fabricating semiconductor devices as claimed in claim 1, wherein:
    said plated film is formed through said plating process by supplying a plating fluid onto said plating seed layer while pressing onto the surface thereof a seal member for blocking such plating fluid from flowing out into the outer peripheral portion of said base member.

3. The method for fabricating semiconductor devices as claimed in claim 1, wherein:
    said plated film is polished together with the underlying plating seed layer through said electrolytic polishing process while pressing onto the surface of said plating seed layer a seal member for blocking an electrolytic polishing fluid from flowing out into the outer peripheral portion of said base member.

4. The method for fabricating semiconductor devices as claimed in claim 1, wherein:
    said base member has an insulating film having a recess formed therein,
    said plating seed layer is formed on an inner surface of said recess with a barrier layer between the plating seed layer and the inner surface, and
    said plated film is formed by said plating process so as to fill such recess.

5. The method for fabricating semiconductor devices as claimed in claim 4, wherein:
    said recess comprises a wiring groove, or a combination of a wiring groove and a connection hole opened in the bottom thereof.

6. A method for fabricating semiconductor devices comprising the steps of:
    forming a plating seed layer on a base member;
    forming by a plating process a plated film on said plating seed layer in an area excluding the outer peripheral portion of said base member wherein the plating process uses an electrical contact that is made with the plating seed layer located in the outer peripheral portion;
    removing by etching said plating seed layer on the outer peripheral portion of said base member; and
    polishing said plated film together with said plating seed layer by a electrolytic polishing process wherein the electrolytic polishing process utilizes an electrical contact that is made with a barrier layer located in the outer peripheral portion and the barrier layer is also located between the plating seed layer and the base member.

7. The method for fabricating semiconductor devices as claimed in claim 6, wherein:
    said plated film is formed through said plating process by supplying a plating fluid onto said plating seed layer while pressing onto the surface thereof a seal member for blocking such plating fluid from flowing out into the outer peripheral portion of said base member.

8. The method for fabricating semiconductor devices as claimed in claim 6, wherein:
    said plated film is polished together with the underlying plating seed layer through said electrolytic polishing process while pressing onto the surface of said base member a seal member for blocking an electrolytic polishing fluid from flowing out into the outer peripheral portion of said base member.

9. The method for fabricating semiconductor devices as claimed in claim 6, wherein:
    said base member has an insulating film having a recess formed therein,
    said plating seed layer is formed on an inner surface of said recess with the barrier layer located between the inner surface and the plating seed layer, and said plated film is formed by said plating process so as to fill such recess.

10. The method for fabricating semiconductor devices as claimed in claim 9, wherein:

said recess comprises a wiring groove, or a combination of a wiring groove and a connection hole opened in the bottom thereof.

11. A method for fabricating semiconductor devices comprising the steps for:

forming a plating seed layer on a base member;

forming a plated film on said plating seed layer in a central surface area of said base member;

polishing said plated film together with said plating seed layer with an electrolytic polishing process while using an outer peripheral portion of the plating seed layer as an electrical contact for the electrolytic polishing process; and thereafter selectively removing said plating seed layer remaining in an outer area of said base member.

12. A method for fabricating semiconductor devices comprising the steps for:

forming a plating seed layer on a base member;

forming a plated film on said plating seed layer in a central surface area of said base member;

removing said plating seed layer in an outer area of said base member; and polishing said plated film together with said plating seed layer with an electrolytic polishing process, wherein the electrolytic polishing process utilizes an electrical contact that is made with a barrier layer located in the outer peripheral portion and the barrier layer is also located between the plating seed layer and the base member.

* * * * *